(12) United States Patent
Brandt et al.

(10) Patent No.: US 8,177,465 B2
(45) Date of Patent: May 15, 2012

(54) ACCIDENT SENSOR

(75) Inventors: Tobby Brandt, Boeblingen (DE); Christian Ohl, Pfulllingen (DE); Boris Adam, Gaeufelden (DE); Martin Schuerer, Aichtal (DE)

(73) Assignee: Robert Bosch GmbH, Stuttgart (DE)

( * ) Notice: Subject to any disclaimer, the term of this patent is extended or adjusted under 35 U.S.C. 154(b) by 243 days.

(21) Appl. No.: 12/304,210

(22) PCT Filed: Jan. 9, 2008

(86) PCT No.: PCT/EP2008/050190
§ 371 (c)(1),
(2), (4) Date: May 21, 2009

(87) PCT Pub. No.: WO2008/104413
PCT Pub. Date: Sep. 4, 2008

(65) Prior Publication Data
US 2009/0238657 A1    Sep. 24, 2009

(30) Foreign Application Priority Data
Feb. 28, 2007   (DE) .................... 10 2007 009 692

(51) Int. Cl.
*F16B 13/06*    (2006.01)
(52) U.S. Cl. ............................ 411/45; 73/756
(58) Field of Classification Search .............. 411/44, 411/45; 73/756
See application file for complete search history.

(56) References Cited

U.S. PATENT DOCUMENTS

| | | | |
|---|---|---|---|
| 5,286,152 A * | 2/1994 | Anderson | 411/45 |
| 5,641,255 A * | 6/1997 | Tanaka | 411/48 |
| 5,846,040 A | 12/1998 | Ueno | |
| 5,945,606 A * | 8/1999 | Tokunaga et al. | 73/756 |
| 6,055,855 A * | 5/2000 | Straub | 73/146.8 |
| 6,439,058 B1 * | 8/2002 | Aratani et al. | 73/756 |
| 6,948,375 B2 * | 9/2005 | Nomura | 73/756 |
| 6,993,976 B2 * | 2/2006 | Fessele et al. | 73/756 |
| 7,312,679 B2 * | 12/2007 | Stuve | 335/215 |
| 7,374,200 B2 * | 5/2008 | Ikeda et al. | 280/728.2 |
| 7,726,922 B2 * | 6/2010 | Slyter | 411/45 |
| 7,794,273 B2 * | 9/2010 | Xu et al. | 439/555 |
| 2005/0123372 A1 | 6/2005 | Sato | |

FOREIGN PATENT DOCUMENTS

| | | |
|---|---|---|
| DE | 196 18 632 | 11/1997 |
| DE | 102 59 527 | 7/2004 |
| EP | 1 445 497 | 8/2004 |
| EP | 1 473 470 | 11/2004 |
| JP | 2006/052015 | 5/2006 |
| WO | WO 2007/054397 | 5/2007 |

OTHER PUBLICATIONS

Wolgang Beitz, Karl-Heinz Kuettner; "Dubbbel, Taschenbush fuer den Maschinenbau, 17 Auflage" 1990, Springer-Verlag, Berlin, Heidelberg, XP002475611 p. G34; figures 48-50.
International Search Report and Written Opinion of PCT/EP08/050190, dated Apr. 23, 2008.

* cited by examiner

*Primary Examiner* — Gary Estremsky
(74) *Attorney, Agent, or Firm* — Kenyon & Kenyon LLP

(57) ABSTRACT

An accident sensor having a fastening arrangement is provided, the fastening arrangement allowing an affixation of the accident sensor on a wall in a vehicle. The accident sensor has at least one bore hole, which has a stud in an elastic sleeve as a fastening arrangement. The stud with the sleeve is configured so that the accident sensor having the stud with the sleeve is affixed in the wall by a clamp.

21 Claims, 5 Drawing Sheets

ACCIDENT SENSOR

FIELD OF THE INVENTION

The present invention relates to an accident sensor.

BACKGROUND INFORMATION

A sensor assembly in which the housing of an air-pressure sensor used for sensing side impacts is mounted on a wall in the vehicle with the aid of fastening arrangement, e.g., screws, is discussed in DE 199 23 985 A1. DE 191 06 311 A1 likewise teaches that an air-pressure sensor is installed in the wall of a partition wall between wet area and dry area in the door. The pressure channel projects into the wet area while the air-pressure sensor itself is situated in the dry area. A sealing cushion is provided, which seals the housing interior from the pressure sensor and also the housing from the partition wall.

SUMMARY OF THE INVENTION

In contrast, the accident sensor according to the present invention having the features of the independent claim, has the advantage that the accident sensor hat as at least one bore hole, which has a stud in an elastic sleeve as the fastening arrangement. The stud with the sleeve is designed in such a way that the accident sensor with the stud in the sleeve is fixed in place in the wall by clamping. This allows an uncomplicated installation of the accident sensor on the wall in the vehicle, e.g., a door panel, no tools being required for the installation. In particular, this fastening method according to the present invention enables a one-handed installation since the other hand is not required for holding a tool. The stud with the sleeve simultaneously seals the hole in the wall so as to seal the dry space in which the accident sensor is located, from the wet space in an efficient manner. This simple method makes it possible to dispense with bushings in the sensor, in particular mechanical outer supports, as in the case of, for example, the screwing technology known from the related art. Due to the elastic shape of the sleeve, the fastening force and the mechanical hardness in the connection to the door panel, and thus also the resonance, can be influenced or specified, as well. In particular, high-frequency mechanical resonances are able to be damped in efficient manner in the process. On account of its design, the accident sensor according to the present invention provides considerable cost savings.

According to the exemplary embodiments and/or exemplary methods of the present invention, the accident sensor is either an acceleration sensor, structure-borne noise sensor or air pressure sensor. It is also possible to install a surround sensor system utilizing the fastening arrangement according to the present invention. Among such surround sensors are video, radar, ultrasound or lidar sensors.

The wall may be a door panel, which separates the wet area from the dry area inside the vehicle door. A vehicle door usually has a wet area, which is on the side on which the window of the vehicle can be lowered.

The stud is usually made of metal, but could also be made of plastic. The stud provides the clamping as a result of its shape, which then leads to an expansion by the sleeve, so that the affixation of the accident sensor is achieved when the stud with the sleeve is guided through the bore hole in the wall. The sleeve has an elastic design, so that it is typically made of a rubber-type or other pliable plastic material, such as silicon. The stud can be preassembled inside the elastic sleeve in the delivery state. Depending on the exact design, the affixation is implemented in such a way, for instance, that the sleeve in its original state, e.g., with preassembled stud, is first slid through the anchoring hole whereupon the stud is pressed into the elastic sleeve, up to an end position, which causes an expansion of the sleeve and thus clamping of the sensor. Because of the clamping, it is impossible for the sleeve with stud, and thus the sensor itself, to simply fall out once it has been pushed through the bore hole in the wall, but instead can be pulled out only with great force.

Advantageous further developments can be gathered from the further description herein.

It is especially advantageous that the stud is designed in such a way that the bolt causes the sleeve to widen and/or spread apart when inserted into the sleeve, the widening or spreading ultimately bringing about the clamping. In other words, the stud can be guided through the wall by itself, but with the sleeve, which is elastic, this can be done only by the use of force in order to compress the sleeve when passing it through, the sleeve relaxing again after the through-feeding and thereby generating resistance against a retraction. This resistance may be produced by widening, i.e., expansion, or by spreading, for instance in that the stud breaks through the sleeve and thereby widens it at the tip.

Furthermore, it is advantageous that the stud has at least one first section for the clamping, and a subsequent second section, which is thinner than the first section. This makes it easy for one section of the sleeve to enlarge or spread apart but the next section then not to do so. This considerably facilitates the manageability of the fastening arrangement according to the exemplary embodiments and/or exemplary methods of the present invention.

In an advantageous manner, the stud can also have a third section, which third section has at least one barb. This barb makes it more difficult for the stud to be pushed out of the sleeve. Other geometric designs of the stud that do not constitute a barb yet nevertheless offer resistance against retraction are possible here as well. This third section may largely be identical to the first section since the enlargement may simultaneously be designed as a barb as well.

In an advantageous manner, the stud elongates the sleeve in its length when inserted into the sleeve. This leads to excellent sealing of the sleeve at the door panel because the sleeve expands in length upon insertion of the stud into the sleeve. As soon as enough tension has then been generated, the constriction of the sleeve slides over the stud, the diameter of the sleeve increases, and the force elongating the sleeve diminishes at the same time, so that the plug of the stud is pulled toward the hole to be sealed and is pressed against it. Given adequate dimensioning, this ensures or improves the sealing effect of the stud.

In an advantageous manner, the sleeve has at least one rib or at least one detent that prevents the sleeve from sliding back once it has been threaded through the door wall.

As mentioned earlier, the stud can be designed in such a way that it penetrates the sleeve when being inserted, so that the sleeve is forced apart or engages behind the stud, and thereby also prevents the stud from being pushed out of the sleeve. The spreading results in an effective clamping effect.

The accident sensor is designed in such a way that the accident sensor releases a plug for the connection of cables only if the stud with the sleeve has been slipped into an end position for an affixation of the accident sensor. This end position means that the stud or the sleeve rests against the accident sensor, so that the clamping effect retains the accident sensor on the wall in an optimal manner. If the stud with the sleeve is not yet resting against the accident sensor, then the stud with the sleeve blocks the access to affix the cables on the accident sensor. This provides an additional safety mechanism, so that the accident sensor is safely installed by the installer.

Exemplary embodiments are depicted in the drawing and are explained in greater detail in the description below.

DETAILED DESCRIPTION

According to the exemplary embodiments and/or exemplary methods of the present invention, an accident sensor with a stud and a sleeve, which are guided through a bore hole in the accident sensor, is fixed in place on a wall in the vehicle in that the stud with the sleeve is threaded through a hole in the wall and supports the accident sensor by a clamping effect. Studs or screws may be used in addition so as to define the installation position more precisely. The more precise installation position can also be aptly defined by the use of the use of a plurality of studs with sleeves. In this context it is possible that the stud is already inside the sleeve before it is fixed in place in the wall or that it is inserted into the sleeve only for the mounting in the wall, after the sleeve has already been passed through the hole in the wall and the clamping effect is produced by an expansion of the sleeve behind the hole in the wall.

Figure 1:
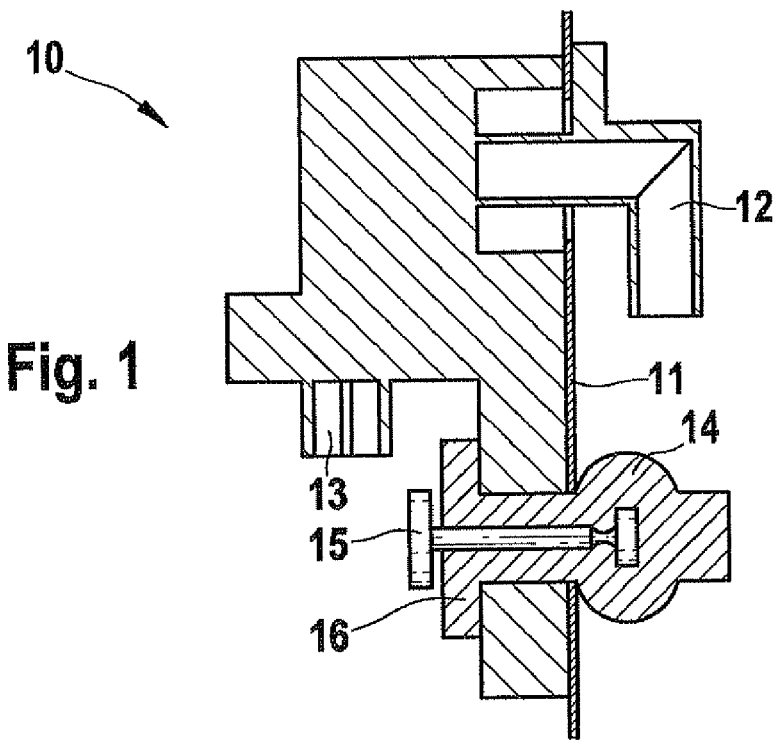
FIG. 1 shows an installation position of the accident sensor according to the present invention.

FIG. 1 schematically illustrates how an air pressure sensor 10 is installed in a vehicle door 11 with the aid of the affixation concept according to the present invention. Inserted through the upper opening in wall 11 is a pressure channel 12 of air pressure sensor 10, in order to be able to measure the air pressure inside the wet space. A bolt 15 with an elastic sleeve 16 is threaded through a second opening of wall 11, bolt 15 causing an expansion 14 in sleeve 16 after having been passed through the opening in the wall, thereby producing a clamping effect that retains sensor 10 on wall 11. In the installed state, stud 15 with sleeve 16 releases a plug or a socket 13 on air pressure sensor 10 to which the signal-conveying cables are able to be connected. This results in an efficient protection against a faulty installation in that the electric connection to air pressure sensor 10 is released only if stud 15 with sleeve 16 is installed correctly.

Figure 2A:
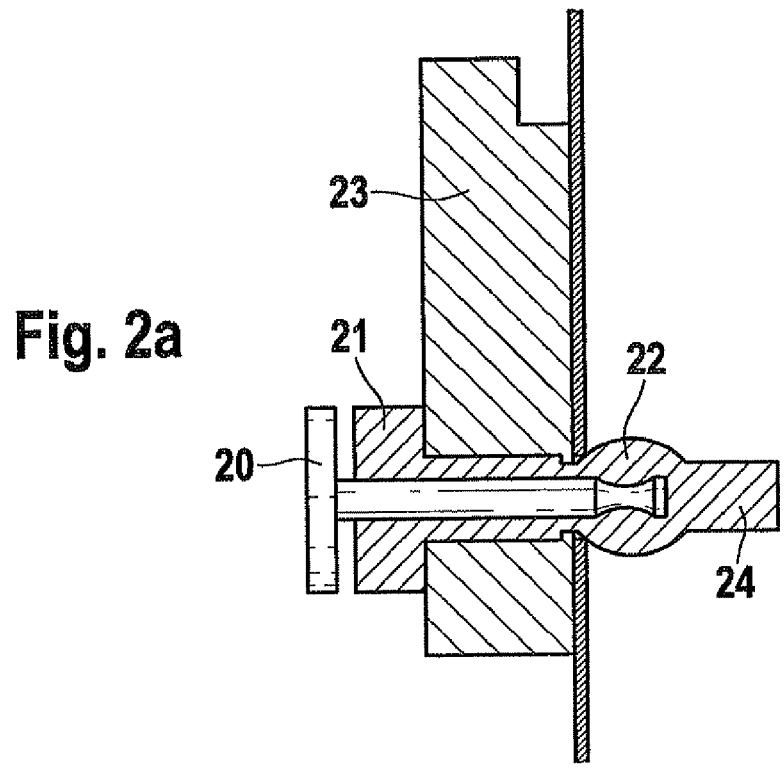
FIG. 2a, FIG. 2b, and FIG. 2c show the installation position or the manner in which the stud is inserted into the sleeve.

FIG. 2a once again shows the installed state of air pressure 23 with sleeve 24 and stud 20, sleeve 24 having an expansion 22 behind the opening in the wall. The sleeve is denoted by 24 in this instance, and sleeve 24 has expansions 21 that engage behind air pressure sensor 23 and in the mounted state retain the air pressure sensor in this manner by the contact pressure by stud 20. Sleeve 24 is able to be appropriately adjusted with regard to hardness in order to absorb a corresponding force.

Figure 2B:
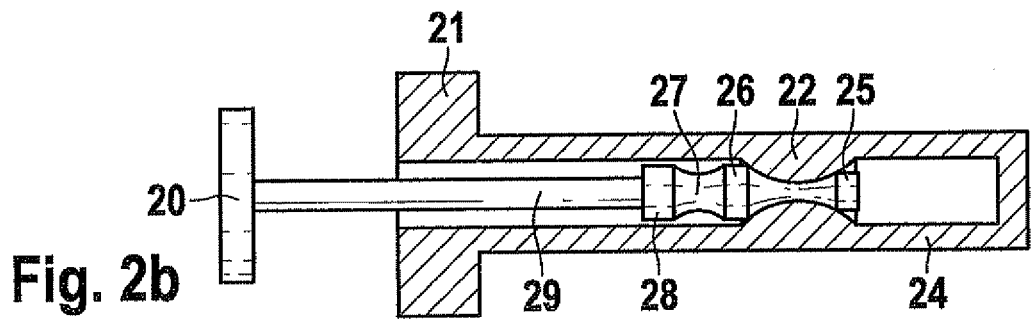

FIG. 2b illustrates how stud 20 is partly inserted into sleeve 24. In the process, a first section 25 is guided through a constriction 22, tip 25 of stud 20 being followed by a section that narrows again. This is followed by an expansion 26 in the stud, which will result in the widening of constriction 22. This expansion 26 is in turn followed by a narrowing 27 and then by another expansion 28, which then also functions as barb. Next is a section 29 with a uniform thickness until the end.

Figure 2C:
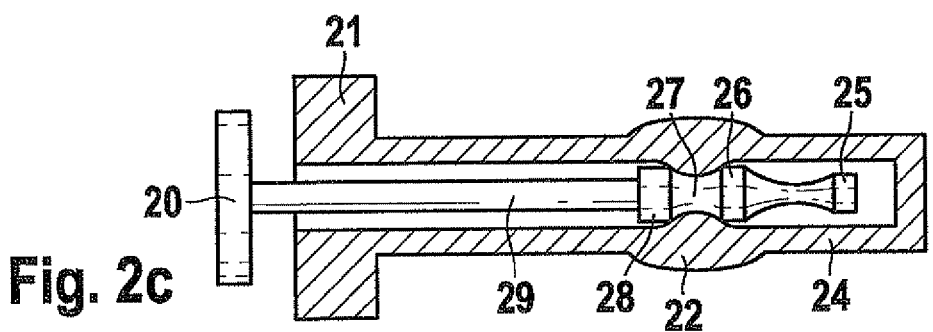

FIG. 2c now illustrates how stud 20 has shifted further and causes widening of sleeve 24 in constriction 22 by its expansions 26 and 28. Identical reference numerals are used for the same elements.

Figure 3A:
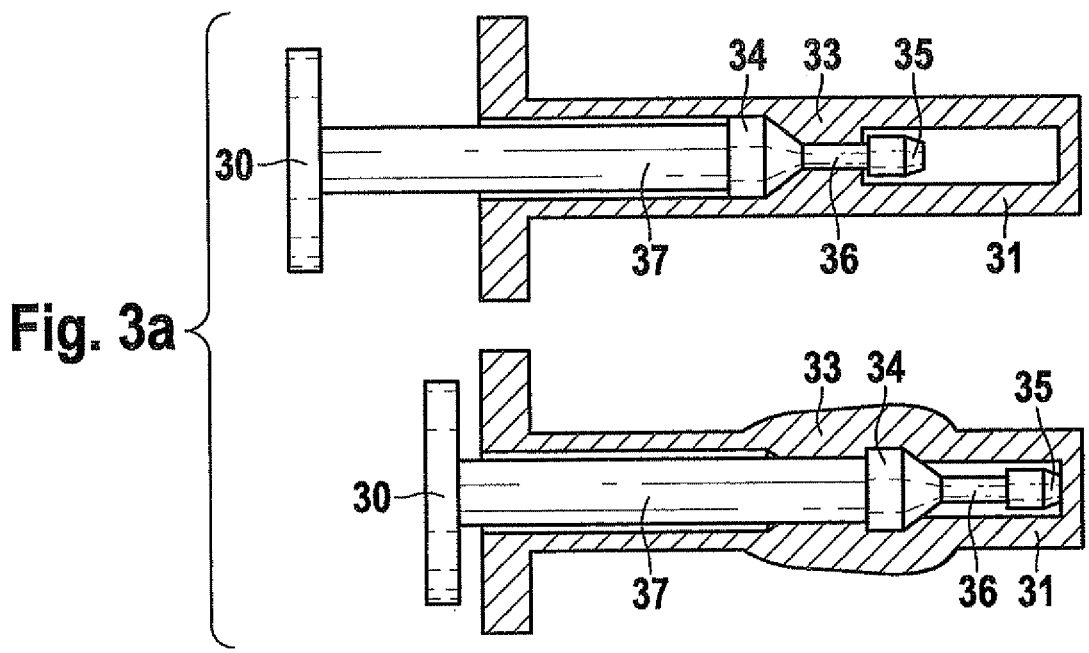
FIG. 3a, FIG. 3b, and FIG. 3c show three examples of one development of the stud-sleeve system.
Figure 3B:
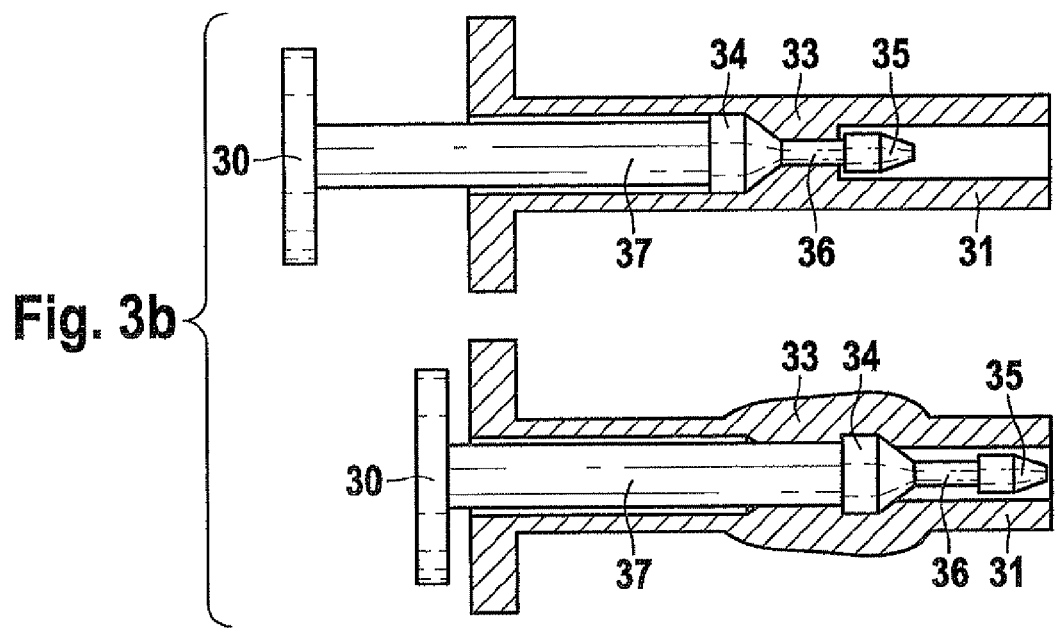
Figure 3C:
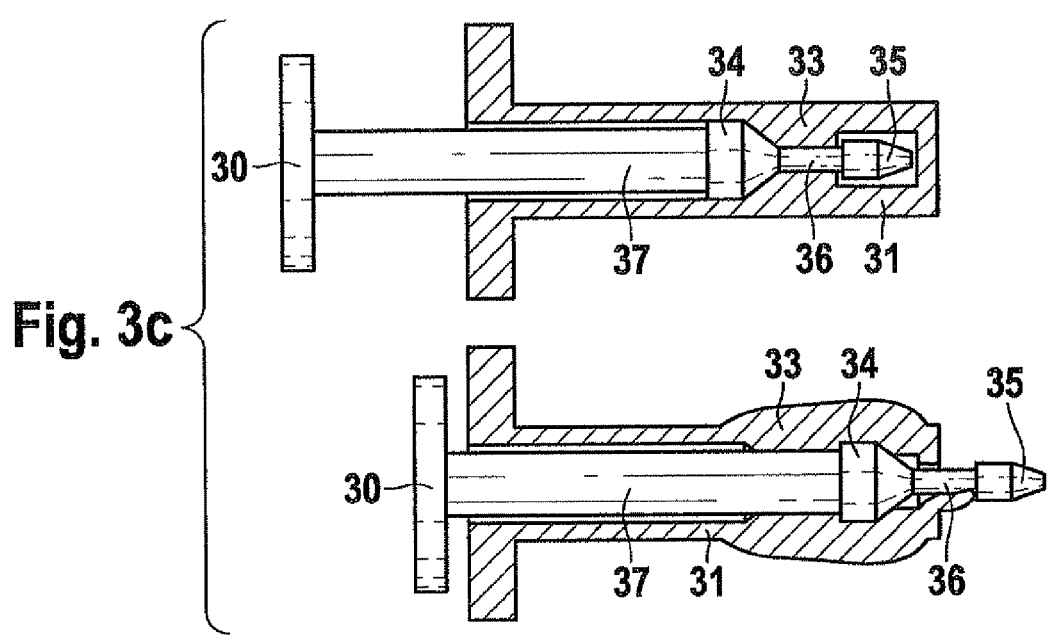

FIGS. 3a to c show possible realizations for the one-handed installation stud having an integrated barb, made up of an elastic sleeve and rigid locking stud. In the upper drawing, FIG. 3a shows the manner in which the stud is threaded through constriction 33, that is to say, by its tip 35, which will not cause an expansion yet. In the lower figure, expansion 34 with the barb then causes widening of constriction 33. Adjacent is a uniform cylinder 37 up to the end of stud 30. Between constriction 33, a section 36 that is relatively thin, is provided as well. In this case, too, identical elements are denoted by the same reference numerals.

FIG. 3b shows an additional configuration, in which tip 35 penetrates the sleeve more deeply. FIG. 3c, on the other hand, shows a puncture through sleeve 31, with section 36 engaging behind tip 35 of stud 30, thereby making it effectively impossible to slide the stud back.

FIG. 3a thus shows a simple development in which the bolt is covered. FIG. 3b shows a production-optimized design for the sleeve, and FIG. 3c shows a design that provides additional mechanical resistance.

Figure 4A:
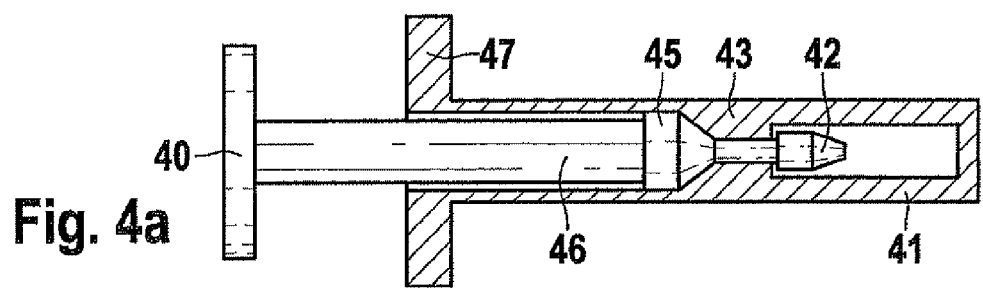
FIG. 4 shows an additional example for the manner in which a stud is inserted into the sleeve.
Figure 4B:
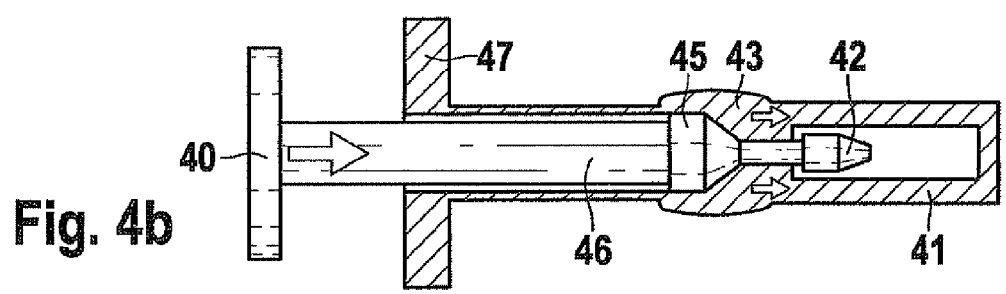
Figure 4C:
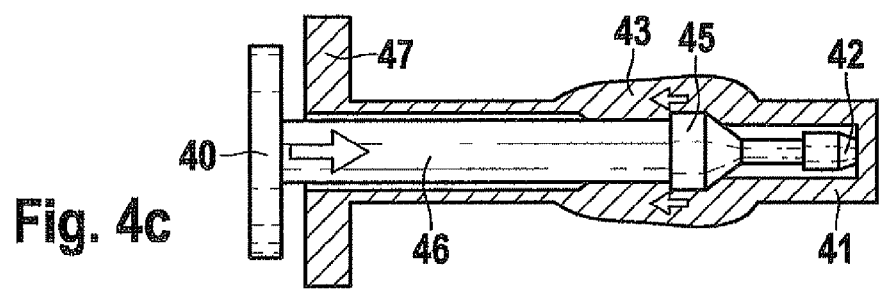

FIGS. 4a through c show a realization of the sealing function of the stud. The bolt as a whole is denoted by reference numeral 40 throughout, and the sleeve by 41; the section engaging behind the wall by 47; the expansion of the stud by 45; the constriction of the sleeve by 43, and the tip of the bolt by 42. The section following the expansion of bolt 45 is denoted by 46. When sleeve 41 slips over the stud and the expansion builds up at constriction 43, the expansion in the sleeve relaxes, and the expansion is drawn into the anchoring hole in the vehicle panel. In this way the hole in the panel is securely sealed by the combination of stud and sleeve. Here, too, identical elements are denoted by the same reference numerals. The arrows indicate the direction of force.

Figure 5A:
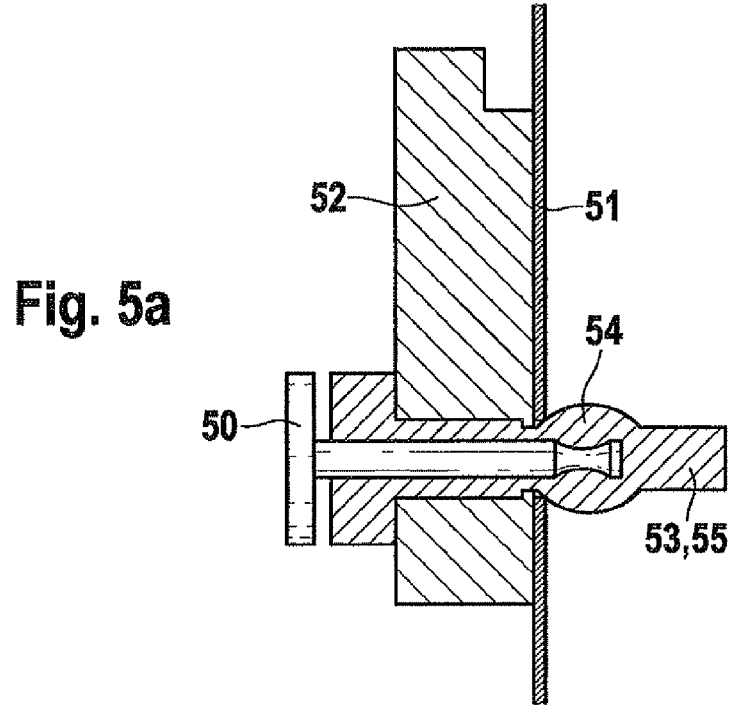
FIG. 5a, FIG. 5b, and FIG. 5c show spreading of the sleeve when the accident sensor is fixed in place.
Figure 5B:
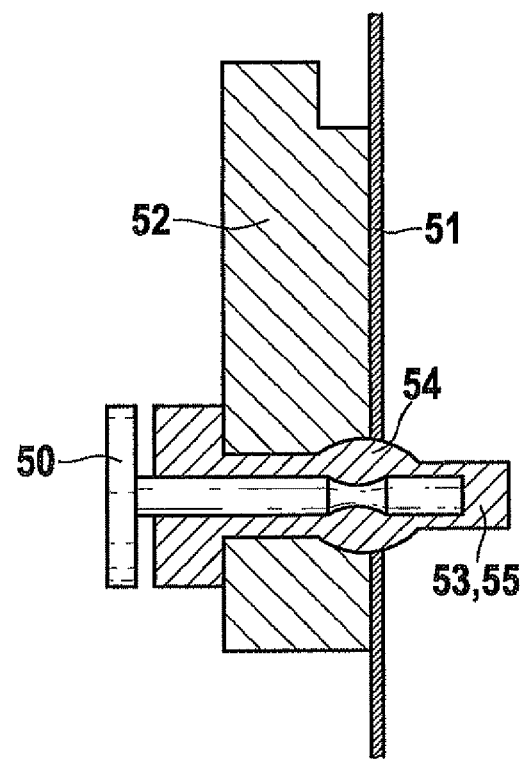
Figure 5C:
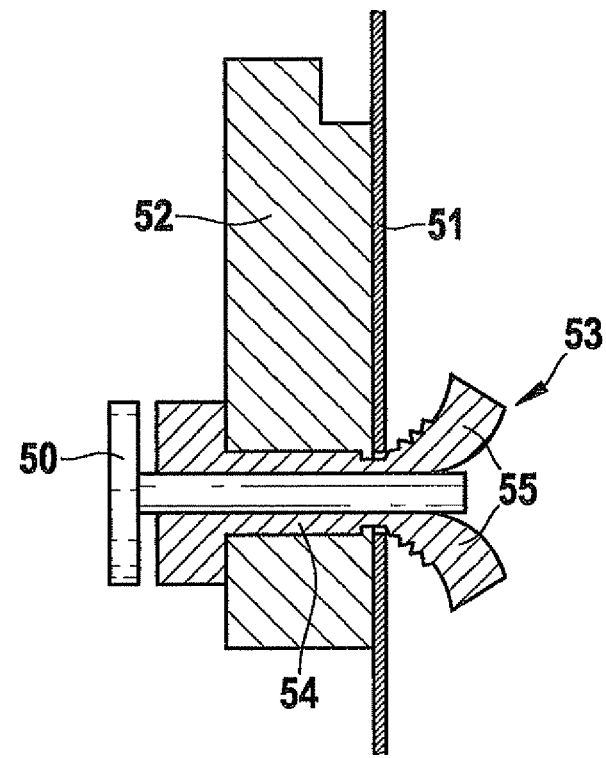

FIGS. 5a to c show different configuration options of the affixation arrangement according to the exemplary embodiments and/or exemplary methods of the present invention. According to FIG. 5a, the fastened state of stud 50 with sleeve 53 in wall 51 is illustrated, the pressure sensor being denoted by 52. Tip 55 of the sleeve and the expansion at former constriction 54 are illustrated. In FIG. 5b it can be seen that expansion 54 is inside the anchoring hole. The affixation then essentially takes place by frictional force and less by tractive force in the sleeve. FIG. 5c shows the complete expansion of sleeve 53, which is illustrated by expansion elements 55. In this way, stud 50 retains accident sensor 52 on wall 51.

What is claimed is:
1. An accident sensor, comprising:
   an accident sensor arrangement; and
   a fastening arrangement to fix the accident sensor arrangement in place on a wall in a vehicle;
   wherein:
      the accident sensor arrangement includes at least one bore hole that passes through a body of the accident sensor arrangement, and that includes a stud in an elastically designed sleeve to provide the fastening;
      the stud with the sleeve is configured so that the accident sensor arrangement including the stud with the sleeve is fixed in place through a hole in the wall by clamping; and
      the sleeve expands in length when the stud is inserted.

2. The accident sensor of claim 1, wherein the stud is configured so that the stud causes the sleeve to at least one of widen and spread apart when slipped into the sleeve, the at least one of the widening and the spreading ultimately bringing about the clamping.

3. The accident sensor of claim 1, wherein the stud includes at least one first section for the clamping, and includes a subsequent second section that is thinner than the first section.

4. The accident sensor of claim 3, wherein the stud includes at least one third section including at least one barb.

5. The accident sensor of claim 4, wherein the first and the third section are substantially identical.

6. The accident sensor of claim 1, wherein the sleeve includes at least one of at least one rib and at least one detent.

7. The accident sensor of claim 1, wherein the stud is configured so that the stud punctures the sleeve in the insertion, and so that the sleeve at least one of spreads open and engages behind the stud.

8. An accident sensor, comprising:
an accident sensor arrangement; and
a fastening arrangement to fix the accident sensor arrangement in place on a wall in a vehicle, wherein:
the accident sensor arrangement includes at least one bore hole, which includes a stud in an elastically designed sleeve to provide the fastening;
the stud with the sleeve is configured so that the accident sensor arrangement including the stud with the sleeve is fixed in place in the wall by clamping; and
the accident sensor is configured so that the accident sensor arrangement releases a plug for a connection of cables only if the stud with the sleeve is slipped into an end position for fixing the accident sensor in place.

9. The accident sensor of claim 8, wherein the stud is configured so that the stud causes the sleeve to at least one of widen and spread apart when slipped into the sleeve, the at least one of the widening and the spreading ultimately bringing about the clamping.

10. The accident sensor of claim 8, wherein the stud includes at least one first section for the clamping, and includes a subsequent second section that is thinner than the first section.

11. The accident sensor of claim 10, wherein the stud includes at least one third section including at least one barb.

12. The accident sensor of claim 11, wherein the first and the third section are substantially identical.

13. The accident sensor of claim 8, wherein the sleeve includes at least one of at least one rib and at least one detent.

14. The accident sensor of claim 8, wherein the stud is configured so that the stud punctures the sleeve in the insertion, and so that the sleeve at least one of spreads open and engages behind the stud.

15. An accident sensor, comprising:
an accident sensor arrangement; and
a fastening arrangement to fix the accident sensor arrangement in place on a wall in a vehicle;
wherein:
the accident sensor arrangement includes at least one bore hole that passes through a body of the accident sensor arrangement, and that includes a stud in an elastically designed sleeve to provide the fastening;
the stud with the sleeve is configured so that the accident sensor arrangement including the stud with the sleeve is fixed in place through a hole in the wall by clamping; and
the accident sensor is configured so that the accident sensor arrangement releases a plug for a connection of cables only if the stud with the sleeve is slipped into an end position for fixing the accident sensor in place.

16. The accident sensor of claim 15, wherein the stud is configured so that the stud causes the sleeve to at least one of widen and spread apart when slipped into the sleeve, the at least one of the widening and the spreading ultimately bringing about the clamping.

17. The accident sensor of claim 15, wherein the stud includes at least one first section for the clamping, and includes a subsequent second section that is thinner than the first section.

18. The accident sensor of claim 17, wherein the stud has at least one third section including at least one barb.

19. The accident sensor of claim 18, wherein the first and the third section are substantially identical.

20. The accident sensor of claim 15, wherein the sleeve includes at least one of at least one rib and at least one detent.

21. The accident sensor of claim 15, wherein the stud is configured so that the stud punctures the sleeve in the insertion, and so that the sleeve at least one of spreads open and engages behind the stud.

* * * * *